(12) United States Patent
Antoniadis et al.

(10) Patent No.: US 6,366,017 B1
(45) Date of Patent: Apr. 2, 2002

(54) ORGANIC LIGHT EMITTING DIODES WITH DISTRIBUTED BRAGG REFLECTOR

(75) Inventors: Homer Antoniadis, Mountain View; Daniel B. Roitman, Menlo Park, both of CA (US)

(73) Assignee: Agilent Technologies, Inc/, Palo Alto, CA (US)

(*) Notice: Subject to any disclaimer, the term of this patent is extended or adjusted under 35 U.S.C. 154(b) by 0 days.

(21) Appl. No.: 09/353,709

(22) Filed: Jul. 14, 1999

(51) Int. Cl.$^7$ .................................................. H01J 63/04
(52) U.S. Cl. ........................................ 313/506; 313/113
(58) Field of Search ................................. 313/501, 504, 313/506, 509, 512, 113

(56) References Cited

U.S. PATENT DOCUMENTS

| | | | |
|---|---|---|---|
| 5,478,658 A | 12/1995 | Dodabalapur et al. | 428/690 |
| 5,608,287 A | 3/1997 | Hung et al. | 313/503 |
| 5,619,058 A | 4/1997 | Kim | 257/431 |
| 5,677,572 A | 10/1997 | Hung et al. | 257/750 |
| 5,703,436 A | * 12/1997 | Forrest et al. | 313/506 |
| 5,714,838 A | 2/1998 | Haight et al. | 313/506 |
| 5,736,754 A | 4/1998 | Shi et al. | 257/89 |
| 5,739,545 A | 4/1998 | Guha et al. | 257/40 |
| 5,776,623 A | 7/1998 | Hung et al. | 428/690 |
| 5,793,062 A | 8/1998 | Kish, Jr. et al. | 257/98 |
| 5,834,893 A | 11/1998 | Bulovic et al. | 313/506 |

FOREIGN PATENT DOCUMENTS

| | | |
|---|---|---|
| WO | WO98/59528 | 12/1998 |
| WO | WO99/02277 | 1/1999 |
| WO | WO99/03087 | 1/1999 |
| WO | WO99/03309 | 1/1999 |
| WO | WO99/20081 | 4/1999 |

OTHER PUBLICATIONS

Bulovic, et al., "Transparent light–emitting devices," Nature, vol. 380, p. 29, Mar. 7, 1996.

Cao, et al., "Improved quantum efficiency for electroluminescence in semiconducting polymers," Nature, vol. 397, pp. 414–417, Feb. 4, 1999.

Friend, et al., "Electroluminescence in conjugated polymers," Nature, vol. 397, pp. 121–128, Jan. 14, 1999.

* cited by examiner

*Primary Examiner*—Vip Patel

(57) ABSTRACT

The present invention provides OLEDs having superior brightness, which can be formed on opaque substrates such as silicon, and methods for producing such OLEDs. OLEDs according to the invention comprise a reflective electrode on the substrate, an organic active layer which provides electroluminescence, an injection layer, and a transparent organic electrode. Light from the active layer which is initially directed backward is reflected by the reflective layer to increase the apparent brightness of the diode in the forward direction.

19 Claims, 2 Drawing Sheets

ORGANIC LIGHT EMITTING DIODES WITH DISTRIBUTED BRAGG REFLECTOR

FIELD OF THE INVENTION

The present invention comprises novel structures for organic light emitting diodes, and methods of making such diodes. The diodes may be fabricated, for example, on silicon or other opaque substrates.

BACKGROUND OF THE INVENTION

Light emitting diodes (LEDs) are well known for use in displays and status indicators, and may comprise organic and/or inorganic materials. Inorganic LEDs have the advantage of providing bright and durable point light sources, while organic LEDs (OLEDs) have the advantage of being large area surface emitting light sources. Commercial development of OLEDs has been hampered, however, by their limited lifetime and sensitivity to moisture and oxygen. Typical prior art OLEDs are fabricated on transparent substrates, and radiate through the substrate to produce light. A typical OLED device comprises a glass substrate, a transparent anode layer (e.g., transparent indium-tin oxide (ITO)), a hole transport layer (e.g., a tertiary amine derivative or a hole transporting conducting polymer), an electron transport layer (e.g., tris(8-hydroxyquinoline) aluminum ($Alq_3$) or poly(phenylene vinylene) derivatives, or polyfluorenes), and a metallic cathode layer (e.g., Mg, Ca, or LiF/Al). For most devices, the electron transport layer also serves as the emission layer. Because the cathode layer is opaque, the device radiates only through the transparent substrate. Further, a significant amount of light is generally waveguided laterally and "lost " through the glass substrate, thus reducing the perceived brightness of the OLED in the forward direction.

It would be desirable to fabricate OLEDs on substrates that allow the reduction of waveguiding losses. One method is to build such a structure on an opaque substrate by inverting the structure so that the cathode is adjacent to the substrate and the transparent (usually ITO) anode is at the top of the device. An advantage of an OLED that does not require a transparent substrate is that the substrate could be made out of silicon. An additional advantage for building the OLED array on silicon is that the substrate can be patterned to define an array of active-matrix current drivers, which could be used to electrically drive the overlying display. Inverted OLEDs have been produced (see, for example, U.S. Pat. No. 5,714,838), but the deposition of ITO onto the organic layers has been found to be difficult (although not impossible) to achieve without degrading the sensitive organic layers. It has also been proposed to use noninverted structures comprising a transparent cathode, but a need remains for innovative OLED structures that can be fabricated on opaque substrates such as silicon. It is an object of the present invention to provide novel OLED structures that can be fabricated on opaque substrates, and particularly on silicon. Furthermore, it is an object of this invention to provide substantially brighter OLEDs, based on opaque substrates, while maintaining ease of fabrication and physical stability of the devices.

SUMMARY OF THE INVENTION

The present invention provides OLEDs having superior brightness, which can be formed on opaque substrates such as silicon, and methods for producing such OLEDs. OLEDs according to the invention comprise a reflective electrode on the substrate, an organic active layer that provides electroluminescence, an injection layer, and a transparent electrode. Light from the active layer that is initially directed backward is reflected by the reflective layer to increase the apparent brightness of the diode in the forward direction. The transparent electrode preferably comprises a transparent organic conducting layer.

The OLED may be a double layer diode comprising an organic hole transport layer (e.g., NPB, m-MTDATA, Pani, PEDOT:PSS, or metal-base and metal-free phthalocyanines) and an organic electron transport layer (e.g., $Alq_3$, poly (phenylene vinylene) derivatives, or polyfluorene copolymers), or it may be a single layer diode comprising an organic electroluminescent material with hole and electron transport properties (e.g., poly(phenylene vinylene) derivatives, or polyfluorene copolymers). The OLED may further be inverted (cathode on substrate) or noninverted (anode on substrate).

The invention also includes methods of fabrication of OLEDs, comprising depositing in sequence on a substrate a reflective electrode, an organic active layer, a transparent injection layer, and a transparent organic electrode, to produce an OLED. The steps of depositing the injection layer and the organic electrode do not damage the electronic and/or emissive properties of the underlying layers.

BRIEF DESCRIPTION OF THE DRAWING

The invention is described with reference to the several figures of the drawing, in which.

DETAILED DESCRIPTION

Figure 1:
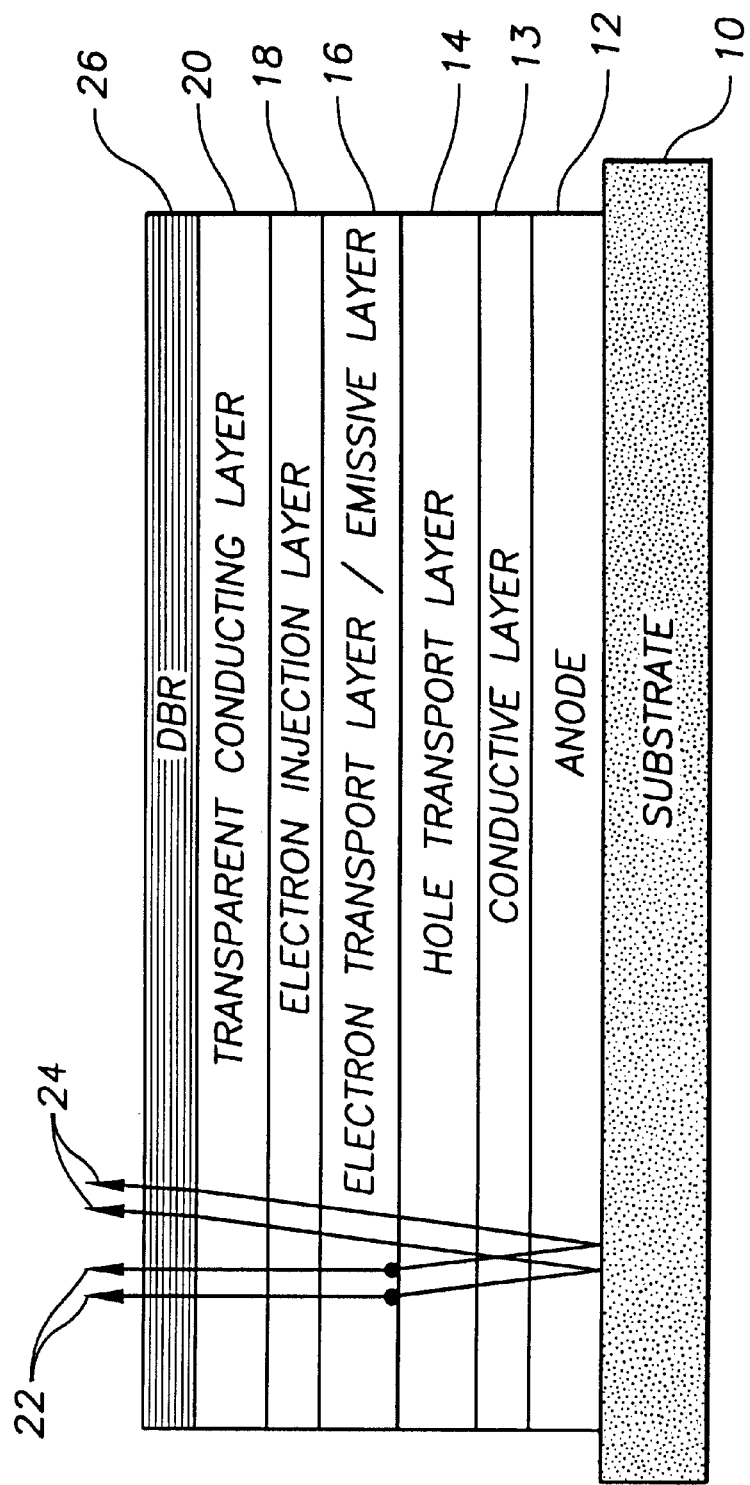
FIG. 1 is a cross-sectional view of an organic light emitting diode according to the invention.

An OLED according to the invention is illustrated in FIG. 1. A substrate 10 may be silicon (either doped or undoped), silicon oxide ($SiO_N$), plastic, glass, or any other material chemically compatible with adjacent layers and sufficiently mechanically robust to support the diode. When a layer 12 is an anode, it comprises a metal having a high work function, preferably greater than about 4 eV, and more preferably greater than about 4.5 eV. The anode 12 preferably is composed of a reflective metal, such as platinum, palladium, iridium, gold, tungsten, nickel, silver or aluminum.

On top of the anode 12, there may be an optional conductive layer 13, which can be formed of a material the work function of which can be tuned according to the content of oxygen, such as indium tin oxide, indium zinc oxide, tin oxide, magnesium indium oxide, or nickel tungsten oxide. Conducting nitride materials such as titanium nitride (TiN) may also be used as the layer 13; the conductivity and work function of TiN can be tuned according to its stoichiometry. The layer 13 could also be made from semi-transparent conducting NiO as described in the publication of Wakefield et al., (Semicond. Sci. Technol Vol. 12, pg. 1304 (1997)). When the metal (layer 12) is not compatible with the substrate and the OLED organic layers, and/or does not have an appropriate work function, its properties can be modified, if needed, by inserting the thin layer 13 of the above mentioned metals, oxides, or nitrides. In general the work function of the layer in contact with the hole transporting layer (layer 12 or layer 13) needs to be higher than or equal to the energy of the highest occupied molecular orbital (HOMO) of the hole transporting layer. The energy of the HOMO is often referred as the ionization potential $I_p$.

An organic hole transport layer (HTL) 14 may comprise any suitable conductor of holes, such as 4-4'-Bis[N-(1-naphthyl)-N-phenylamino]-biphenyl (NPB), 4,4',4"-tris {N-(3-methylphenyl)-N-phenylamino} triphenylamine (m-MTDATA), conducting polyaniline (Pani), polyethylenedioxythiophene-polystyrenesulfonate (PEDOT:PSS), thiophenes, metal-base or metal-free phthalocyanines, and many other suitable materials that will be known to those of ordinary skill in the art. A large number of suitable hole transport materials are disclosed in International Patent Application WO 99/20081, which is incorporated herein by reference. The hole transport layer may be deposited by any of a number of processes, depending on the selected compositions of the HTL 14 and the anode 12, including thermal vacuum evaporation coating, spin coating, dip coating, doctor-blading, roll-coating, injection-fill, embossing, stamping, physical or chemical vapor deposition, and other techniques known to those skilled in the art.

In the illustrated embodiment, an electron transport layer (ETL) 16 also serves as the electroluminescent layer. This layer 16 may comprise electroluminescent small molecule conductors such as $Alq_3$, or electroluminescent polymers known in the art such as poly(phenylene vinylene) (PPV), polyfluorene copolymers, or derivatives or copolymers of these polymers. A number of materials having suitable electron transport and emissions properties are described in U.S. Pat. Nos. 5,608,287, 5,708,130, 5,776,623, and 5,777,070, which are incorporated herein by reference. As will be apparent to those of ordinary skill in the art, the electroluminescent layer may also be a separate layer sandwiched between the hole transport layer and the electron transport layer. The electron transport layer 16 may be deposited by any of the methods described above for the deposition of the HTL 14.

In general, an electron injection layer 18 may be formed by a metal having work function lower than 3.5 eV. This metal can be, for example, an alkali, alkaline earth or rare earth metal, the work function of which should be lower or equal to energy of the lowest unoccupied molecular orbital (LUMO) of the electron transporting layer. The energy of the LUMO is often referred to as the electron affinity $E_A$. In some cases, instead of a low work function metal, a thin layer of suitable alkali or alkaline earth oxide or fluoride, such as CaO, $Li_2O$, MgO, LiF, $MgF_2$, CsF, or $CaF_2$, may be used, followed by a capping metal layer such as silver or aluminum. The work function of the metal is not critical when such a layer is used.

For top emitting, noninverted OLEDs, the cathode must be transparent. Thus, when a low work function metal is used, the electron injection layer 18 must be less than about 50 nm thick. The layer 18 could also comprise a very thin (<10 nm) layer, followed by a stable (for instance gold or platinum), transparent capping metal layer 20 thinner than 50 nm. If an oxide or fluoride is used for the layer 18, the capping metal layer 20 must still be thinner than about 50 nm.

In some other cases (e.g., in International Patent Application WO 99/20081), to establish even more transparent cathodes, a very thin low work function metal layer 18, has been followed by a transparent conductive oxide, layer 20. However, in these cases care needs to be taken to avoid degradation of the OLED during the deposition of the conductive oxide.

In the current invention, we propose an improvement where an organic transparent conducting layer 20 is deposited on top of the layer 18. (If conducting layer 20 has a low work function, layer 18 may not be required). To avoid altering the low work function properties of layer 18 the organic transparent conducting layer may be coated by vacuum thermal deposition or spin coated from water free solutions or dispersions. Examples of organic layers that may be used are conductive thiophenes, polyanilines, polyethylenedioxythiophenes or derivatives of the above. Furthermore, the transparent conductive layer 20 may be a composite of a transparent inorganic conductor with an organic binder. For instance, the inorganic transparent conductor may be consist of ITO or IZO micro-particles or nano-particles dispersed in a transparent polymer binder such as polycarbonate at densities to establish good conductivity. It is intended that the "organic electrodes" described herein shall include such inorganic/organic composite electrodes.

In use, when a biasing voltage is applied, the electron transport layer 16 will emit light of a wavelength characteristic of the material of the layer. About half of this light will be emitted in a generally upward direction according to a Lambertian emission pattern, as shown by arrows 22 in the figure. The other half of the light will be emitted in a generally downward direction, as shown by the arrows 24 in the figure. Light emitted in the downward direction is mostly lost and scattered unless the anode 12 is reflective and redirects this light upwards to increase the apparent brightness of the OLED. These devices will not suffer from light losses usually encountered on devices made on glass substrates (due to waveguiding). Instead, the reflected light from the bottom electrode will be emitted from the top electrode. Thus, in general, devices made on substrates having conductive and reflective coatings are expected to be more efficient. The efficiency of the above mentioned device can be further enhanced if a distributed Bragg reflector (DBR) 26 is be placed atop the transparent cathode, or under the anode (if the anode is transparent or semi-transparent). A DBR 26 is a stack of alternating layers of high and low refractive indices, with better than 99% reflectivity at wavelengths emitted by the LED. The introduction of a DBR layer 26 will, in general, introduce microcavity effects, which will alter the pattern of emitted light and its wavelength dependence. The thickness of the organic layers (layer 14 and layer 16) may also be controlled to implement a microcavity effect. This microcavity structure could be used to further enhance the emitted light in a given wavelength and direction.

Figure 2:
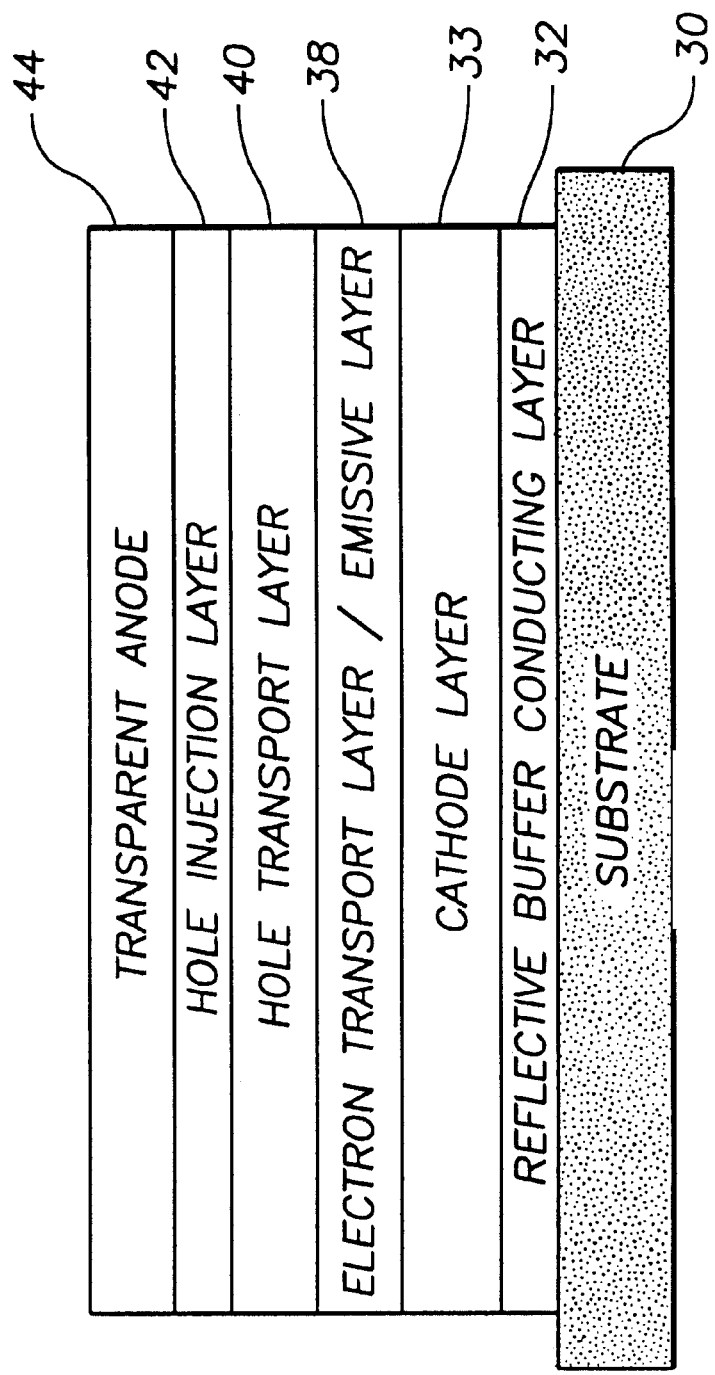
FIG. 2 is a cross-sectional view of another organic light emitting diode according to the invention.

Another embodiment of the present invention is shown in FIG. 2. An inverted top emitting device is again built upon a substrate 30, which may be pure or doped silicon, a plastic, a glass, or any other chemically compatible and mechanically suitable material. In particular, the substrate may be (but is not required to be) opaque.

FIG. 2 shows an inverted diode structure, with the cathode close to the substrate, and a transparent anode on the top of the device. A stable metal layer 32, compatible with the substrate, may be placed directly on the substrate to act as a buffer conducting layer for a cathode layer 33. The layer 32 could be made from platinum, palladium, iridium, gold, tungsten, nickel, silver or aluminum or other metal known in the art. The layer 33 may comprise a metal having work function lower than 3.5 eV. This metal can be, for example, an alkali, alkaline earth or rare earth metal. The work function of the layer 33 should be lower than or equal to the energy of the lowest unoccupied molecular orbital (LUMO) of the electron-transporting layer. In some cases, instead of a low work function metal, a thin (0.5–10 nm) layer 33 of suitable alkali or alkaline earth oxide or fluoride, such as CaO, Li$_2$O, MgO, LiF, MgF$_2$, CsF, or CaF$_2$ may be used. Conducting nitride materials such as titanium nitride (TiN) may also be used as layer 33; the conductivity and work function of TiN can be tuned according to its content of Ti.

The active portion of the OLED comprises ETL 38 and HTL 40, and may further comprise an emissive layer (not shown) sandwiched between them. If no separate emissive layer is present, then either the ETL 38 or the HTL 40 must comprise an electroluminescent material. All of the previously described electron transport and hole transport materials are suitable for use in this embodiment of the invention. Between the active portion of the OLED and an anode 44, an injection layer 42 may be included, to facilitate the injection of holes into the OLED. Suitable materials for this layer 42 will depend on the materials selected for the anode 44 and the HTL 40. When a gold anode is used, very thin nickel or nickel oxide are expected to be particularly good injection layers, since they function both to improve conductivity and to help the gold adhere. The injection layer should be at least partially transparent so that the OLED can emit light. Furthermore, the work function of the hole injection layer should be chosen to match the HOMO of the layer 40.

The anode 44 may be either a very thin layer of a high work function metal such as gold, platinum or palladium, or a transparent conductor. If a thin metal layer is used, it should be thin enough that a substantial portion of the light produced by the OLED can be transmitted through the anode 44. Transparent organic conductors are preferred anode materials. Examples of these organic layers are conductive thiophenes, polyanilines, derivative polyethylenedioxythiophenes or derivatives of the above.

As described above in connection with FIG. 1, the OLED depicted in FIG. 2 can be deposited on an opaque substrate. Reflective layer 32 operates to reflect the light in the forward direction, thus increasing the brightness of the device. If desired, a DBR (not shown) may also be used at the top of this OLED to further increase efficiency as well as directionality of the emitted light.

EXAMPLES

Top Emitting (Anode Down)

Example 1

A P-type silicon substrate is coated with 150 nm of SiO$_2$ by using sputtering deposition. A 150 nm layer of Al is then sputtered to form the anode. A conducting polymer such as conducting polyaniline (Pani), or polyethylenedioxythiophene-polystyrenesulfonate (PEDOT:PSS) is then spin coated to form a film of about 100 nm thickness. A soluble form of fluorine copolymer or a soluble derivative of poly(phenylene vinylene) is then spin coated to form a thin film of about 100 nm. A thin layer of Ca of about 5 nm is then thermally evaporated, followed by 10 nm of Au, also thermally evaporated.

Example 2

A P-type silicon substrate is coated with 150 nm of SiO$_2$ by using sputtering deposition. A 150 nm layer of Iridium (Ir) is then sputtered to form the anode. A conducting polymer such as conducting polyaniline (Pani), or polyethylenedioxythiophene-polystyrenesulfonate (PEDOT:PSS) is then spin coated to form a film of about 100 nm thickness. A soluble form of fluorine copolymer or a soluble derivative of poly(phenylene vinylene) is then spin coated to form a thin film of about 100 nm. A thin layer of Ca of about 5 nm thickness is then thermally evaporated, followed by 10 nm of Au, also thermally evaporated.

Example 3

A P-type silicon substrate is coated with 150 nm of SiO$_2$ by using sputtering deposition. A 150 nm layer of W is then sputtered to form the anode. A conducting polymer such as conducting polyaniline (Pani), or polyethylenedioxythiophene-polystyrenesulfonate (PEDOT:PSS) is then spin coated to form a film of about 100 nm thickness. A soluble form of fluorine copolymer or a soluble derivative of poly(phenylene vinylene) is then spin coated to form a thin film of about 100 nm. A thin layer of Ca of about 5 nm is then thermally evaporated, followed by 10 nm of Au, also thermally evaporated.

Example 4

A P-type silicon substrate is coated with 150 nm of SiO$_2$ by using sputtering deposition. A 150 nm layer of Pt is then sputtered to form the anode. A conducting polymer such as conducting polyaniline (Pani), or Polyethylenedioxythiophene-polystyrenesulfonate (PEDOT:PSS) is then spin coated to form a film of about 100 nm thickness. A soluble form of fluorine copolymer or a soluble derivative of poly(phenylene vinylene) is then spin coated to form a thin film of about 100 nm. A thin layer of Ca of about 5 nm is then thermally evaporated, followed by 10 nm of Au, also thermally evaporated.

Example 5

A P-type silicon substrate is coated with 150 nm of SiO$_2$ by using sputtering deposition. A 150 nm layer of Pt is then sputtered to form the anode. A conducting polymer such as conducting polyaniline (Pani), or polyethylenedioxythiophene-polystyrenesulfonate (PEDOT:PSS) is then spin coated to form a film of about 100 nm thickness. A soluble form of fluorine copolymer or a soluble derivative of poly(phenylene vinylene) is then spin coated to form a thin film of about 100 nm. A thin layer of CsF of about 1 nm is then thermally evaporated, followed by 10 nm of Au or Al, also thermally evaporated.

Example 6

A P-type silicon substrate is coated with 150 nm of SiO$_2$ by using sputtering deposition. A 150 nm layer of W is then sputtered followed by 150 nm of ITO to form the anode. A conducting polymer such as conducting polyaniline (Pani), or polyethylenedioxythiophene-polystyrenesulfonate (PEDOT:PSS) is then spin coated to form a film of about 100 nm thickness. A soluble form of fluorine copolymer or a soluble derivative of poly(phenylene vinylene) is then spin coated to form a thin film of about 100 nm. A thin layer of Ca of about 5 nm is then thermally evaporated, followed by 150 nm of ITO. ITO is sputtered on at temperatures lower than 100 C.

Example 7

A P-type silicon substrate is coated with 150 nm of SiO$_2$ by using sputtering deposition. A 150 nm layer of W is then sputtered, followed by 150 nm of ITO to form the anode. A conducting polymer such as conducting polyaniline (Pani), or polyethylenedioxythiophene-polystyrenesulfonate (PEDOT:PSS) is then spin coated to form a film of about 100 nm thickness. A soluble form of fluorine copolymer or a soluble derivative of poly(phenylene vinylene) is then spin coated to form a thin film of about 100 nm. A thin layer of Ca of about 5 nm is then thermally evaporated, followed by 150 nm of a spin coated conducting polymer such as conducting polyaniline (Pani), or polyethylenedioxythiophene-polystyrenesulfonate (PEDOT:PSS). The solution or dispersion of the conducting polymer must be water free.

Top Emitting Inverted (Cathode Down)

Example 8

An N- type or P-type silicon substrate is coated with 150 nm of $SiO_2$ by using sputtering deposition. A 150 nm film of Al is then sputtered to form the underlying metal, which acts as a cathode. A soluble form of fluorine copolymer or a soluble derivative of poly(phenylene vinylene) is then spin coated to form a thin film of about 100 nm. A conducting polymer such as conducting polyaniline (Pani), or (PEDOT:PSS) is then spin coated to form a thin film of about 100 nm. A thin layer of Au of about 20 nm is then thermally evaporated to form the anode.

Example 9

An N- type or P-type silicon substrate is coated with 150 nm of $SiO_2$ by using sputtering deposition. A 150 nm film of Pt or W is then sputtered to form the underlying metal. A thin layer of CsF or $MgF_2$ of about 1 nm thickness is then thermally evaporated to form the cathode. A soluble form of fluorine copolymer or a soluble derivative of poly(phenylene vinylene) is then spin coated to form a thin film of about 100 nm. A conducting polymer such as conducting polyaniline (Pani), or polyethylenedioxythiophene-polystyrenesulfonate (PEDOT:PSS) is then spin coated to form a thin film of about 100 nm. A thin layer of Au of about 20 nm thickness is then thermally evaporated to form the anode.

Example 10

An N- type or P-type silicon substrate is coated with 150 nm of $SiO_2$ by using sputtering deposition. A 150 nm film of Pt or W is then sputtered to form the underlying metal. A thin layer of CsF or $MgF_2$ of about 1 nm is then thermally evaporated to form the cathode. A soluble form of fluorine copolymer or a soluble derivative of poly(phenylene vinylene) is then spin coated to form a thin film of about 100 nm. A conducting polymer such as conducting polyaniline (Pani), or polyethylenedioxythiophene-polystyrenesulfonate (PEDOT:PSS) is then spin coated to form a thin film of about 100 nm. A thin layer of Au of less than 20 nm is then thermally evaporated to form the anode, followed by 100 nm of ITO sputtered at low temperatures.

Other embodiments of the invention will be apparent to those skilled in the art from a consideration of the specification or practice of the invention disclosed herein. It is intended that the specification and examples be considered as exemplary only, with the true scope of the invention being indicated by the following claims.

What is claimed is:

1. An organic light emitting diode (OLED), comprising, in sequence:
   an opaque substrate;
   a reflective electrode;
   an organic active layer;
   a transparent injection layer;
   a transparent organic electrode; and
   a distributed Bragg reflector (DBR),
   wherein the active layer of the OLED emits light in response to a biasing voltage applied across the electrodes, a first portion of said light passing directly through the transparent injection layer and the transparent electrode, and a second portion of said light being reflected from the reflective electrode and subsequently transmitted through the transparent injection layer and the transparent electrode, and wherein the DBR acts to increase the emission of light in a substantially forward direction.

2. The OLED of claim 1, wherein the organic active layer comprises an organic hole transport layer and an organic electron transport layer.

3. The OLED of claim 2, wherein the organic hole transport layer comprises a material selected from the group consisting of NPB, m-MTDATA, Pani, thiophenes, PEDOT:PSS, metal-base phthalocyanines and metal-free phthalocyanines.

4. The OLED of claim 2, wherein the organic electron transport layer comprises a material selected from the group consisting of $Alq_3$, poly(phenylene vinylene), polyfluorene, and derivatives and copolymers thereof.

5. The OLED of claim 1, wherein the organic active layer comprises a material selected from the group consisting of poly(phenylene vinylene), polyfluorene, and derivatives and copolymers thereof.

6. The OLED of claim 1, wherein the reflective electrode functions as an anode, the organic transparent electrode functions as a cathode, and the injection layer is an electron injection layer.

7. The OLED of claim 6, wherein the anode comprises a material selected from the group consisting of platinum, palladium, iridium, gold, tungsten; nickel, silver, and aluminum.

8. The OLED of claim 6, wherein the transparent organic cathode comprises a material selected from the group consisting of thiophenes, polyanilines, polyethylenedioxythiophenes, inorganic/organic composite materials, and mixtures and derivatives thereof.

9. The OLED of claim 6, further comprising a conductive layer positioned between the anode and the active layer, the conductive layer acting to increase the effective work function of the anode.

10. The OLED of claim 9, wherein the conductive layer comprises a material selected from the group consisting of indium tin oxide (ITO), indium zinc oxide, tin oxide, magnesium indium oxide, nickel tungsten oxide, nickel oxide, titanium nitride, and metals having work functions in excess of 4.0 eV.

11. The OLED of claim 1, wherein the reflective electrode functions as a cathode, the transparent electrode functions as an anode, and the injection layer is a hole injection layer.

12. The OLED of claim 11, wherein the cathode comprises a material selected from the group consisting of alkalis, alkaline earths, rare earth metals, conductive nitrides, CaO, $Li_2O$, MgO, LiF, $MgF_2$, CsF, $CaF_2$, and TiN.

13. The OLED of claim 11, wherein the transparent organic anode comprises a material selected from the group consisting of thiophenes, polyanilines, polyethylenedioxythiophenes, inorganic/organic composites, and mixtures and derivatives thereof.

14. The OLED of claim 11, wherein the cathode comprises a reflective metal layer and a low work function layer having a work function less than 3.5 eV.

15. The OLED of claim 14, wherein the reflective metal layer comprises a metal selected from the group consisting of platinum, palladium, iridium, gold, tungsten, nickel, silver, and aluminum, and the low work function layer comprises a material selected from the group consisting of alkalis, alkaline earths, rare earth metals, conductive nitrides, CaO, $Li_2O$, MgO, LiF, $MgF_2$, CsF, $CaF_2$, and TiN.

16. An organic light emitting diode (OLED), comprising, in sequence:
   a substrate;
   a conductive buffer layer;
   a first electrode layer, the buffer layer enhancing conduction between the substrate and the first electrode layer;
   an organic active layer;
   a transparent carrier injection layer;
   a metallic second electrode layer, the metallic layer being at least partially transparent to light produced by the OLED; and
   a distributed Bragg reflector (DBR),
   wherein the active layer of the OLED emits light in response to a biasing voltage applied across the first and second electrodes, a first portion of said light passing directly through the transparent carrier injection layer and the second electrode, and a second portion of said light being reflected from the first electrode and subsequently transmitted through the transparent carrier injection layer and the second electrode, and wherein the DBR acts to increase the emission of light in a substantially forward direction.

17. A method of producing an organic light emitting diode (OLED), comprising:
   depositing a reflective electrode on a substrate;
   depositing an organic active layer on the reflective electrode;
   depositing a transparent injection layer on the organic active layer, the deposition not substantially altering electroluminescent properties of the organic active layer;
   depositing a transparent organic electrode on the injection layer, the deposition not substantially altering electroluminescent properties of the organic active layer or injection properties of the injection layer; and
   depositing a distributed Bragg reflector (DBR) on the transparent organic electrode,
   wherein the active layer emits light in response to a biasing voltage applied across the electrodes, a first portion of said light passing directly through the transparent injection layer and the transparent electrode, and a second portion of said light being reflected from the reflective electrode and subsequently transmitted through the transparent injection layer and the transparent electrode, and wherein the DBR acts to increase the emission of light in a substantially forward direction.

18. The method of claim 17, wherein deposition of the transparent organic electrode is by a method selected from the group consisting of thermal vacuum evaporation coating, spin coating, dip coating, doctor-blading, roll-coating, injection-fill, embossing, stamping, physical vapor deposition and chemical vapor deposition.

19. The method of claim 17, wherein the transparent organic electrode comprises a material selected from the group consisting of conductive thiophenes, polyanilines, polyethylenedioxythiophenes, organic/inorganic composites, and combinations and derivatives thereof.

* * * * *